United States Patent
Ulen et al.

(10) Patent No.: US 7,042,727 B2
(45) Date of Patent: May 9, 2006

(54) HEAT SINK MOUNTING AND INTERFACE MECHANISM AND METHOD OF ASSEMBLING SAME

(75) Inventors: Neal E. Ulen, Lacey, WA (US); David Shia, Bellevue, WA (US); Sandeep Ahuja, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 10/672,022

(22) Filed: Sep. 26, 2003

(65) Prior Publication Data

US 2005/0068740 A1    Mar. 31, 2005

(51) Int. Cl.
*H05K 7/20*    (2006.01)
(52) U.S. Cl. .............. 361/704; 361/719; 257/718; 257/719; 174/16.3; 165/80.3
(58) Field of Classification Search ........ 361/687–723, 361/748–804, 697, 702; 165/80.3; 257/718–719, 257/722, 727, 705, 706, 707, 713; 174/16.1, 174/16.3; 24/458
See application file for complete search history.

(56) References Cited

U.S. PATENT DOCUMENTS

| | | | | |
|---|---|---|---|---|
| 6,097,601 A | * | 8/2000 | Lee | 361/704 |
| 6,239,974 B1 | * | 5/2001 | Tseng | 361/704 |
| 6,404,634 B1 | * | 6/2002 | Mann | 361/704 |
| 6,639,804 B1 | * | 10/2003 | Chen | 361/719 |
| 2004/0047130 A1 | * | 3/2004 | Liu | 361/704 |
| 2005/0111190 A1 | * | 5/2005 | Wang et al. | 361/704 |

* cited by examiner

*Primary Examiner*—Lynn Feild
*Assistant Examiner*—Zachary Pape
(74) *Attorney, Agent, or Firm*—Buckley, Maschoff & Talwalkar LLC

(57) ABSTRACT

In some embodiments, a method includes providing a circuit board having a plurality of holes formed therethrough and mounting a spring to an underside of the circuit board such that the mounted spring has a plurality of holes each of which is aligned with a respective one of the holes in the circuit board. Bosses of the spring are each sandwiched between a respective standoff on a chassis and a respective standoff on a heat sink. Holes in the circuit board at the locus of the standoffs are sized so that the circuit board is not sandwiched between the standoffs. The spring presses the circuit board upwardly to bring an integrated circuit in contact with the heat sink.

9 Claims, 6 Drawing Sheets

US 7,042,727 B2

HEAT SINK MOUNTING AND INTERFACE MECHANISM AND METHOD OF ASSEMBLING SAME

BACKGROUND

Increased demands on cooling systems for electronic devices are an unwanted by-product of advances in the development in integrated circuits (ICs), and particularly in processors. One response to these demands may be to increase the size of heat sinks that are provided to dissipate heat from IC packages. However, previously proposed arrangements for mounting heat sinks and interfacing heat sinks to IC packages may limit the size of heat sinks that can be employed without undue risk of damage to the electronic device in the event of dynamic loading during transport.

DETAILED DESCRIPTION

Figure 1:
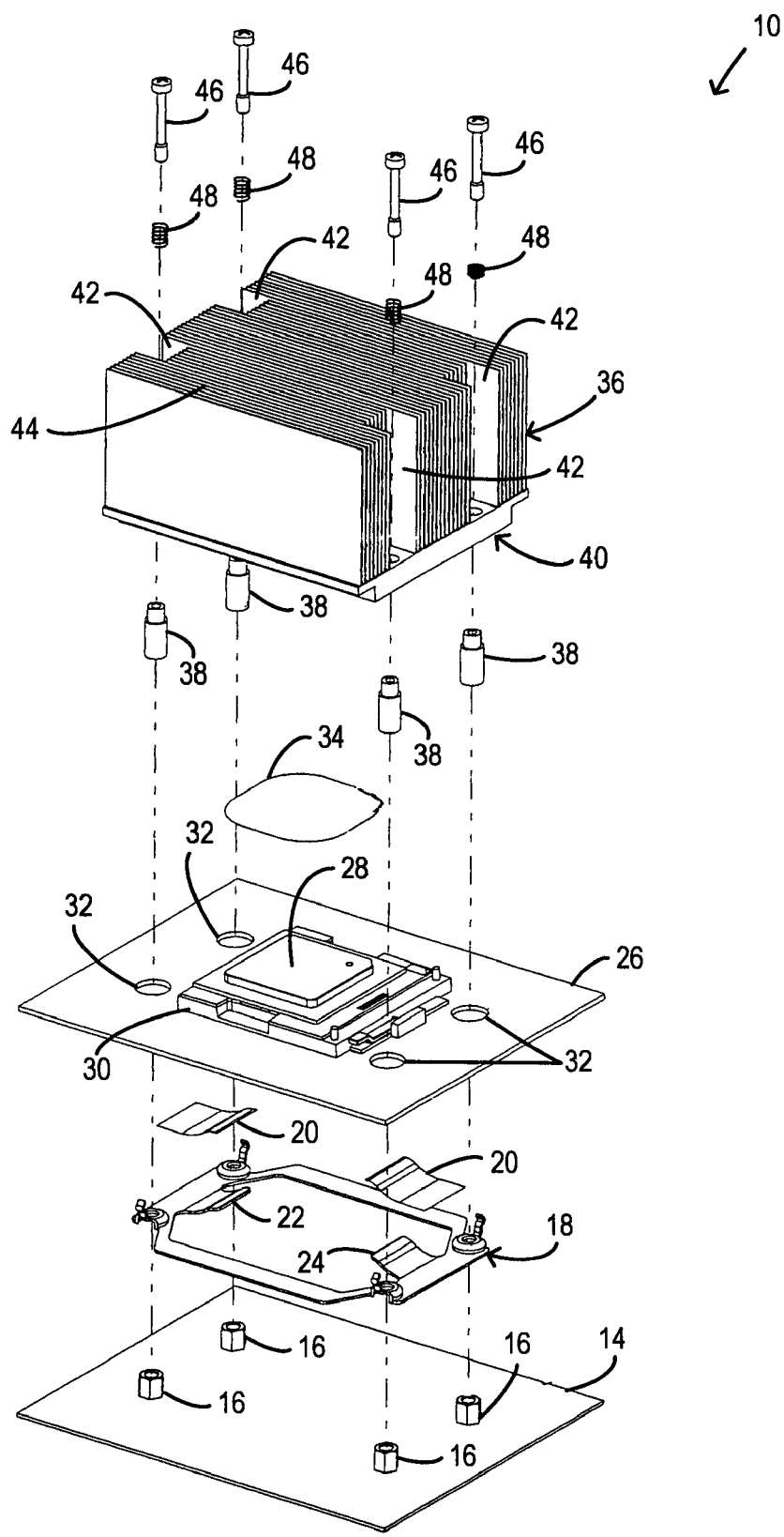
FIG. 1 is an exploded view of an electronic apparatus provided according to some embodiments.
Figure 2:
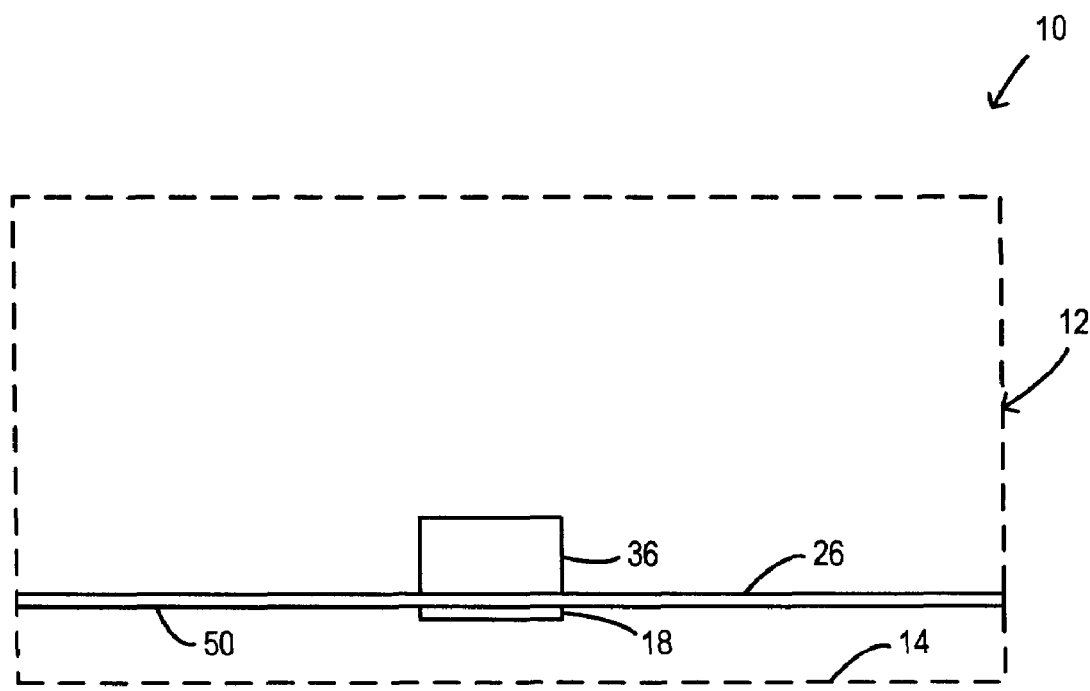
FIG. 2 is a simplified schematic side view of the apparatus of FIG. 1 in an assembled condition.

FIG. 1 is a partial exploded view of an electronic apparatus or system 10 which is provided according to some embodiments, and which may constitute, for example, all or a portion of a server computer or a workstation computer. FIG. 2 is a simplified schematic side view of the system 10 in an assembled condition.

The system 10 includes a chassis 12, of which a lower portion is constituted by a chassis pan 14. (In FIG. 1, only a relevant portion of the chassis pan 14 is shown.) Chassis standoffs 16 (FIG. 1; omitted from FIG. 2 to simplify the drawing) are provided on the chassis pan 14 and extend upwardly therefrom. The chassis standoffs 16 are located relative to each other in a pattern so as to define a rectangle (not separately indicated), in some embodiments. The chassis standoffs 16 may be integrally formed with the chassis pan 14 or may be separate pieces mounted in a suitable manner on the chassis pan 14.

The system 10 also includes a circuit board loading spring 18. Details of the spring 18 and of its function will be described below with reference to FIGS. 3 and 8. The system 10 may further include insulating tape segments 20 which may, respectively, be provided for mounting on the upper surfaces of the tips of spring fingers 22, 24 of the spring 18. When mounted on the spring fingers 22, 24, the tape segments 20 may be considered to be included as parts of the spring 18. The tape segments 20 and their functions will be further described below.

Also included in the system 10 is a circuit board 26 (e.g., a motherboard) which carries an integrated circuit (IC) package 28 installed in a socket 30 on the circuit board 26. (In FIG. 1 only a relevant portion of the circuit board 26 is shown. Also, to simplify the drawings, FIG. 1 and the other drawings omit features of the circuit board 26 such as vias, conductive traces and/or devices that may be installed on the circuit board 26 in addition to the IC package 28.) The IC package 28 may comprise, for example, a microprocessor.

Holes 32 are formed through the circuit board 26. The holes 32 are located, in some embodiments, in a pattern so as to define a rectangle (not separately indicated) that substantially or nearly circumscribes the socket 30 and the IC package 28. Also, the pattern of the holes 32 corresponds to the pattern of the chassis standoffs 16.

The system 10 also includes a thermal interface material (TIM) 34. Although the TIM 34 is depicted as a solid object, in some embodiments the TIM 34 may, for example, be constituted by a layer of thermal grease on the upper surface of the IC package 28 and/or on a lower surface of the heat sink to be described below. Alternatively, the TIM 34 may be a suitable "phase change" material that may be semisolid at room temperature but may be liquid at the operating temperature of the IC (not separately shown) that is contained within the IC package 28.

The system 10 further includes a heat sink 36 with which heat sink standoffs 38 are associated. Although the heat sink standoffs 38 are illustrated as being separate from the heat sink 36, nevertheless in some embodiments the heat sink standoffs 38 may be integrated with the heat sink 36 so as to be mounted on a lower side 40 of the heat sink 36. The heat sink standoffs 38 may be mounted on the heat sink 36 in a rectangular pattern that matches the patterns of the chassis standoffs 16 and of the holes 32 in the circuit board 26. In the same pattern, indents 42 may be formed in the fins 44 of the heat sink 36 to allow for installation of retention screws (also referred to as "fasteners") 46 that are also included in the system 10. A respective screw tension spring 48 is associated with each of the retention screws 46. In some embodiments, the heat sink 36, the heat sink standoffs 38, the retention screws 46 and the screw tension springs 48 may all be integrated to form a heat sink assembly.

As will be readily appreciated by those who are skilled in the art, the heat sink 36 may be provided to be thermally interfaced to the IC package 28 by the TIM 34 to dissipate heat generated by operation of the IC in the IC package 28.

In the simplified schematic view provided in FIG. 2, the system 10 is shown in an assembled condition. The chassis 12 is indicated with dashed lines to aid in distinguishing other components shown in the drawing. Aside from the circuit board 26, the spring 18 and the heat sink 36, other components shown in FIG. 1, as well as other components of the system 10, are omitted to simplify the drawing. As indicated in FIG. 2, the circuit board 26 may be mounted in the chassis 12. This may be done, for example, in accordance with conventional practices. The spring 18 is below the circuit board 26 and the heat sink 36 is above the circuit board 26. As will be seen from subsequent description, the spring 18 is mounted to the underside 50 of the circuit board 26, but (somewhat contrary to the impression provided by FIG. 2) substantial support for the heat sink 36 is provided by the chassis pan 14 via the chassis standoffs 16 and the heat sink standoffs 38 shown in FIG. 1.

Figure 3:
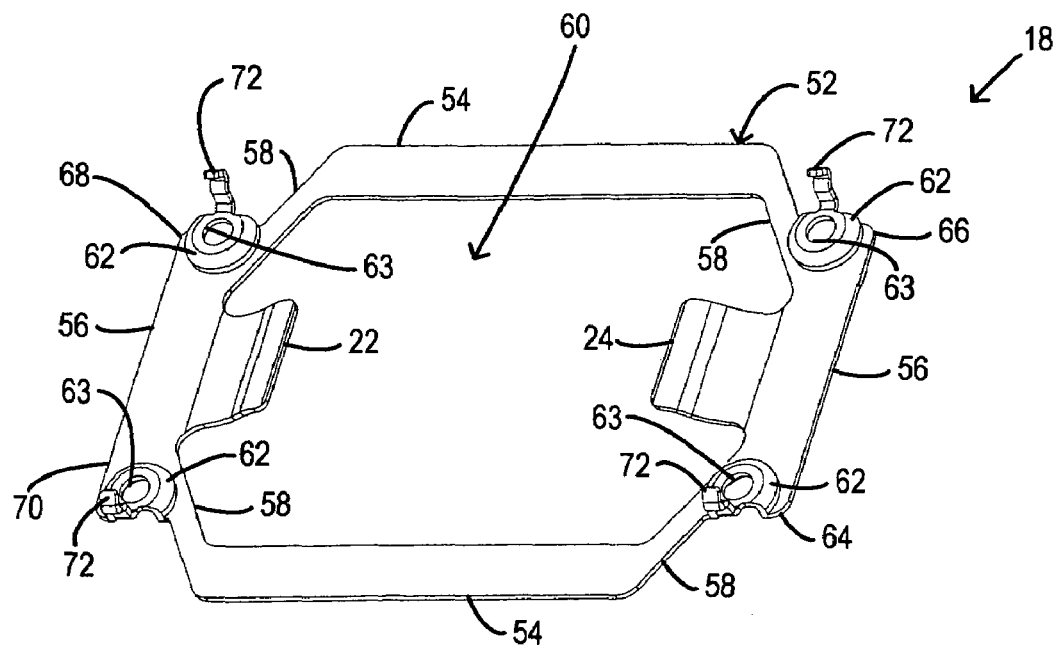
FIG. 3 is an isometric view of a circuit board loading spring that is part of the apparatus of FIGS. 1 and 2.

Details of the spring 18 will now be described initially with reference to FIG. 3.

The spring 18 may be formed as a single unitary piece of material. The material of which the spring 18 is formed may be, for example, stainless steel (e.g., 301 stainless steel) or cold rolled steel that has been heat treated and nickel plated. As one alternative, the spring 18 may be formed of plastic. In general, the spring 18 may be formed of any material having suitable spring loading characteristics.

The spring 18 may, in some embodiments, include a perimeter section 52 that includes two long sides 54 that are opposite to each other, two sides 56 that are of intermediate length and that are opposite to each other, and four short sides 58, each of which joins an end of a long side 54 to an end of a side 56. It will be noted that the sides 54, 56, 58 collectively are around and define an open space 60. The long sides 54 are substantially equal in length to each other and are longer than the sides 56. The sides 56 are substantially equal in length to each other. The short sides 58 are substantially equal in length to each other and are shorter than the sides 56 (accordingly also being shorter than the long sides 54). The short sides 58 may have a width that is substantially smaller than the widths of the sides 54, 56.

The perimeter section 52, being formed of eight sides in all, is substantially octagonal, but in other embodiments other polygonal forms, or even non-polygonal forms may be employed for the perimeter section 52. An advantage of the perimeter section 52 shown in FIG. 3, and at least one specific alternative form of perimeter section 52, will be discussed below.

The spring 18 also includes the spring fingers 22, 24, referred to above, each of which extends inwardly and upwardly in an inclined fashion from a respective one of the sides 56. As used herein, "inwardly" refers to a direction toward the center of the open space 60 from the respective side 56. As will be seen, a function of the spring fingers 22, 24 is to apply a load to the underside 50 (FIG. 2) of the circuit board 36 at the locus of the IC package 28 (FIG. 1), to aid in maintaining the top of the IC package 28 in a thermally coupled position relative to the heat sink 36 via the TIM 34.

Referring once more to FIG. 3, the spring 18 further includes bosses 62, which are formed in, and which extend upwardly from, ends 64, 66, 68, 70 of the sides 56 from which the fingers 22, 24 extend. A respective hole 63 is formed at the top of each of the bosses 62. The bosses 62 are shaped and sized to key onto the chassis standoffs 16 (FIG. 1) when the system 10 is in an assembled condition. It will be understood that the relative positioning of the bosses 62 corresponds to the rectangular patterns of the chassis standoffs 16, the heat sink standoffs 36 and the holes 32 formed in the circuit board 26. In some embodiments the rectangle defined by those patterns and by the bosses 62 may have dimensions such as 1.5 inches by 3.2 inches, for example. Corresponding width and length extents of the spring 18 as a whole may be 2.5 inches by 3.4 inches, for example.

It will be appreciated that the width of the empty space 60 defined by the perimeter section 52 is greater than it would be if the perimeter section 52 were formed as a rectangle with the long sides 54 connected directly to the ends 64, 66, 68, 70 of the sides 56 instead of being connected to the ends 64, 66, 68, 70 by the short sides 58. The additional width of the empty space 60 thus provided may advantageously allow the perimeter section 52 to be clear of devices or other components (not shown) mounted on the underside 50 (FIG. 2) of the circuit board 26, when the spring 18 itself is mounted to the underside of the circuit board. However, if such clearance is not required (e.g., if no components are present on the underside of the circuit board or if any such components are small enough to fit within the rectangular pattern of the bosses, standoffs and circuit board holes), then the short sides 58 of the perimeter section 52 may be dispensed with and the perimeter section 52 may, for example, be formed in a substantially rectangular shape that corresponds to the rectangular pattern of the bosses, standoffs and circuit board holes.

In addition the spring 18 includes board attach fingers 72 each of which extends upwardly from a respective one of the bosses 62 at outer sides of the bosses 64 relative to the sides 56 of the perimeter section 52. Thus the board attach fingers 72 extend upwardly from the perimeter section 52, and each of the board attach fingers 72 is located at a respective one of the ends 64, 66, 68, 70 of the sides 56.

Figure 4:
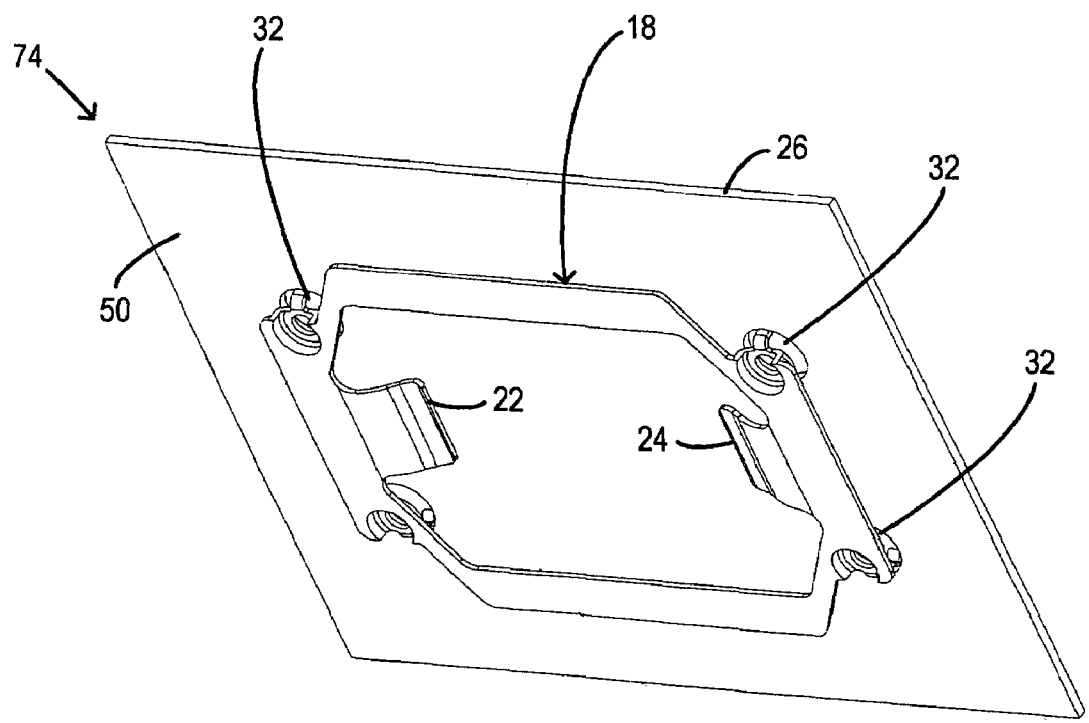
FIG. 4 is an isometric view, taken from below, of an assembly of the spring of FIG. 3 and a circuit board that is part of the apparatus of FIGS. 1 and 2.
Figure 5:
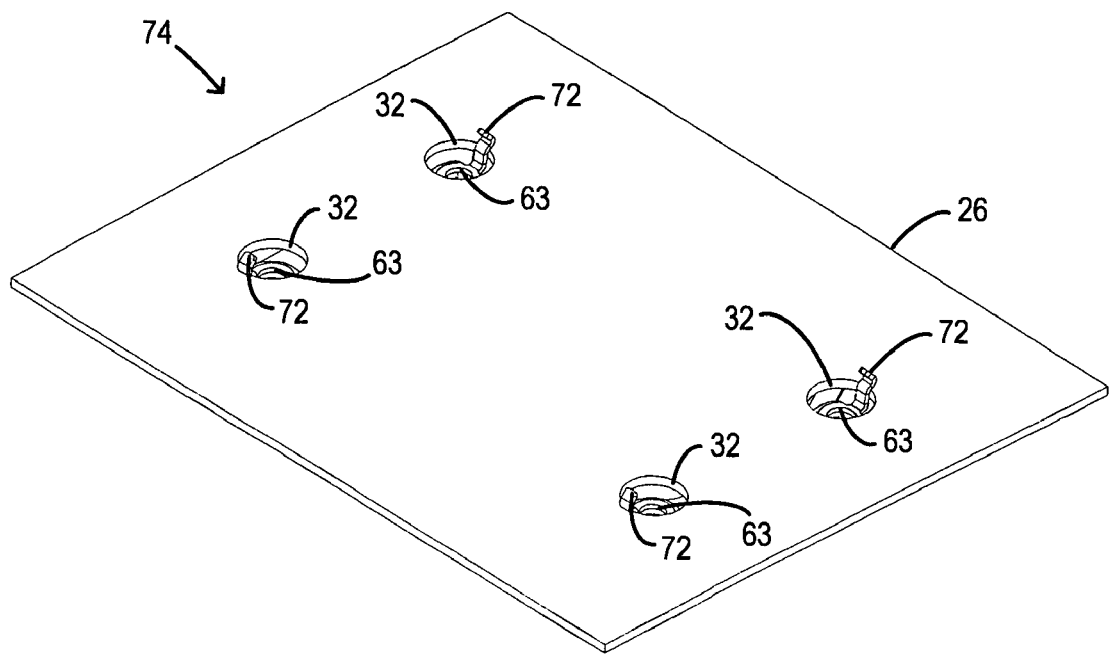
FIG. 5 is an isometric view, taken from above, of the assembly of FIG. 4.

The board attach fingers 72 are provided to engage with edges of the holes 32 (FIGS. 1, 4, 5) formed in the circuit board 26 to allow for the spring 18 to be mounted via the board attach fingers 72 to the underside 50 (FIG. 2) of the circuit board 26. FIG. 4 is an isometric view, taken from below, showing an assembly 74 formed of the circuit board 26 and the spring 18 mounted to the underside 50 of the circuit board 26. FIG. 5 is an isometric view taken from above of the assembly 74. As seen from FIG. 4, the spring fingers 22, 24 of the spring 18 are in contact with the underside 50 of the circuit board 26. As will be appreciated from FIG. 5, each of the board attach fingers 72 extends through a respective one of the holes 32 formed in the circuit board 26. As best recognized from FIG. 5, each of the holes 63 in the bosses 62 of the spring 18 is aligned with a respective one of the holes 32 in the circuit board 26.

In some embodiments, a method for assembling the assembly 74 may include providing the circuit board 26 having the holes 32 formed through the circuit board 26, and mounting the spring 18 to the underside 50 of the circuit board 26 with the holes 63 of the spring bosses each aligned with a respective one of the holes 32 in the circuit board. This method may include inserting each of the board attach fingers 72 of the spring 18 through a respective one of the holes 32 of the circuit board.

The assembling of the assembly 74 may be performed in some cases by a manufacturer or supplier of the circuit board 26. In other cases, the assembling of the assembly 74 may be performed by the entity which integrates or assembles the entire system 10. In the former case, the assembly of the system as a whole may be streamlined by the use of assemblies 74 provided by the manufacturer/supplier.

The tape segments 20 (FIG. 1) are not visible in FIGS. 4 and 5, but may have been applied to the upper surfaces of the spring fingers 22, 24 prior to the assembling of the assembly 74. The tape segments 20 may include a suitable electrically insulating material such as polyimide (e.g., the material sold by Dupont under the trademark Kapton®). A function of the tape segments 20 may be to electrically isolate the spring 18 from conductive traces or other features of the circuit board 26 that are present on the underside 50 of the circuit board 26 at points where a mechanical load is applied to the underside of the circuit board by the spring fingers 22, 24. The tape segments 20 may also prevent the underside of the circuit board 26 or any features thereon from being scratched or abraded by the spring fingers 22, 24.

Figure 6:
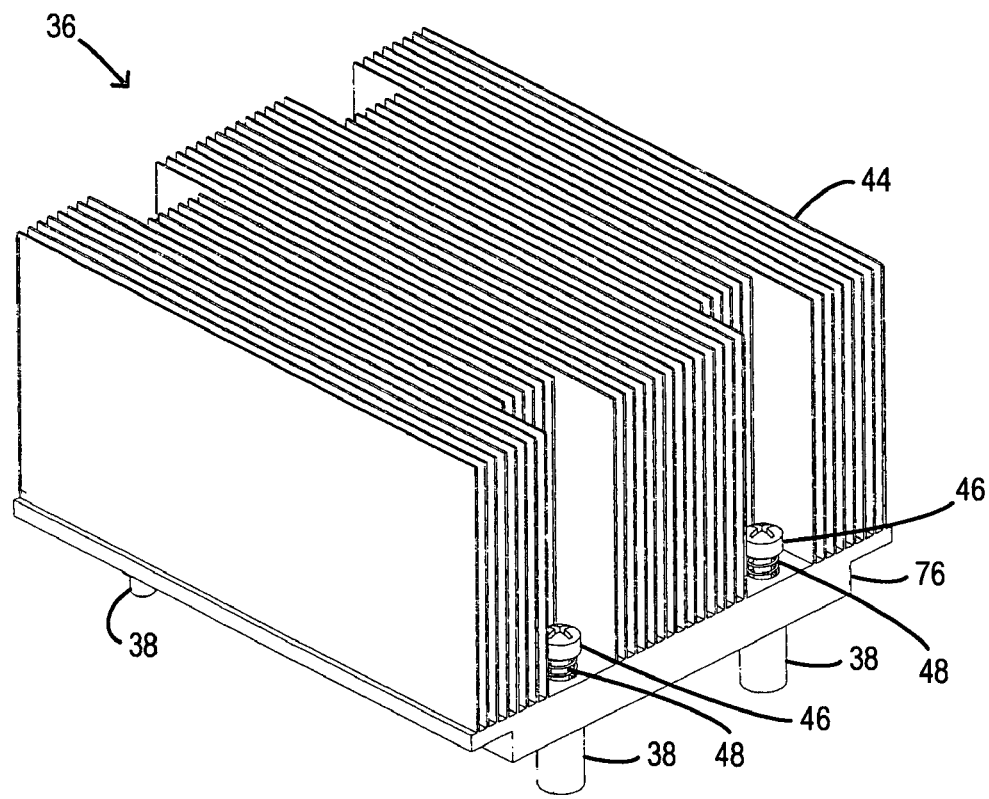
FIG. 6 is an isometric view of a heat sink that is part of the apparatus of FIGS. 1 and 2.

Some details of the heat sink 36 will now be described with reference to FIG. 6, which provides an isometric view of the heat sink. The heat sink standoffs 38 are depicted as integrated with a base 76 of the heat sink 36. Retention screws 46 are shown installed extending downwardly into the standoffs 38 with screw tension springs around upper portions of the shanks of the retention screws. The heat sink 36 may be copper/copper in some embodiments (i.e., copper base and copper fins). In other embodiments, the fins may be made of aluminum. In some embodiments the fins 44 are stacked fins; in other embodiments the fins may be crimped, folded or skived. In some embodiments the heat sink may incorporate a fan, which is not shown. Another type of heat dissipation device having the same retention interface may be substituted for the heat sink. Such an alternative heat dissipation device may include a fan or a vapor chamber.

Figure 7:
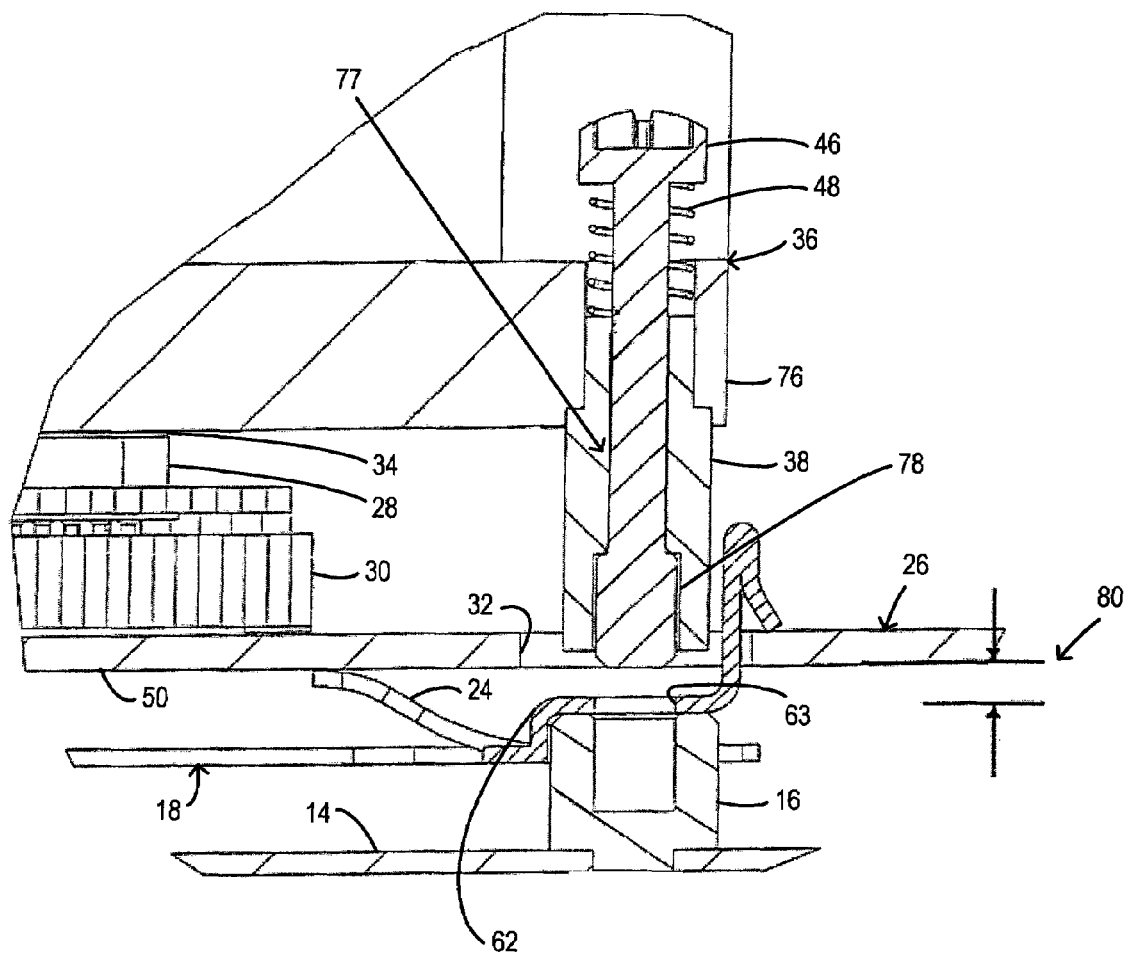
FIG. 7 is a partial side cross-sectional view showing the apparatus of FIG. 1 in a partially assembled condition.
Figure 8:
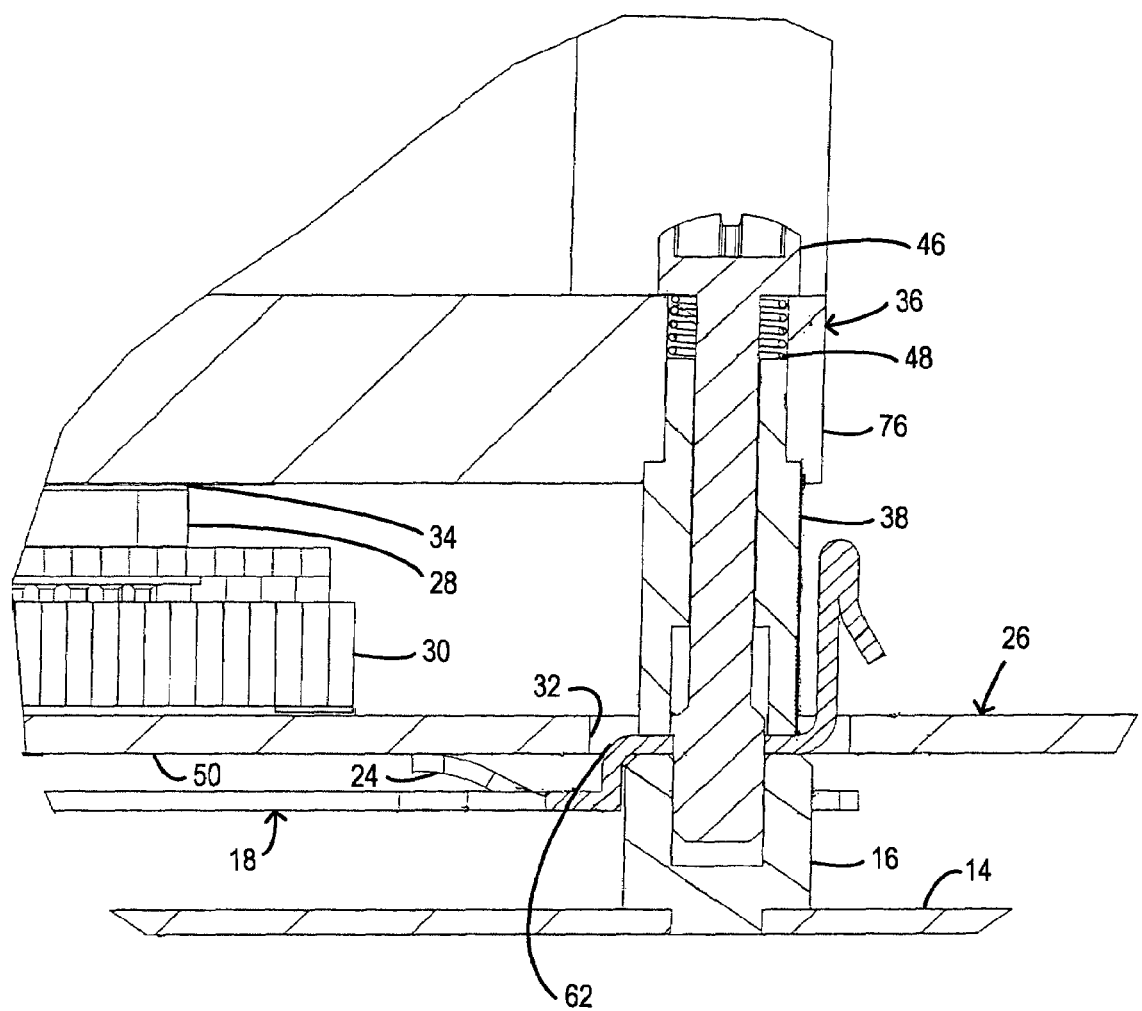
FIG. 8 is a view similar to FIG. 7, showing the apparatus in a more fully assembled condition.

FIG. 7 is a side cross-sectional view of a portion of the system 10 at the locus of one of the chassis standoffs 16, which is also the locus of one of the heat sink standoffs 38. FIG. 7 shows the system 10 in a condition prior to complete assembly, the condition being such that the retention screw 46 has not yet been "activated" so as to be threadedly engaged with the chassis standoff 16. FIG. 8 is a view similar to FIG. 7, but showing the condition of the system 10 after activation of the retention screw 46 and in a fully assembled condition. FIGS. 7 and 8 both show the boss 62 of the spring 18 engaging the chassis standoff 16. It should be noted that in the region indicated at 77 in FIG. 7, respective portions of the heat sink standoff 38 and the retention screw 46 may be threadedly engaged with each other, although the threads are not shown. As seen from FIG. 7, before another threaded portion 78 of the retention screw 46 is engaged with the threaded interior (threads not separately indicated in either case in the drawings) of the chassis standoff 16, the spring finger 24 of the spring 18 applies a load to the underside 50 of the circuit board 26 so that the circuit board 26 is deflected upwardly from a home position, as indicated at 80. As the retention screw is activated by being threadingly driven into the chassis standoff 16, the heat sink 36 is forced downward to press against the IC package 28 (via the TIM 34) to push the circuit board 26 down to its home position (indicated in FIG. 8) against the spring force applied to the underside 50 of the circuit board 26 by the spring finger 24 of the spring 18.

The holes 32 in the circuit board 26 are wide enough in diameter so as to accommodate the standoff and the spring bosses 62 without touching or binding. The retention screw 46 extends through the heat sink standoff 38, through the hole 32 in the circuit board 26, through the hole 63 in the boss 62 of the spring 18, and into the chassis standoff 16. The boss 62 of the spring 18 is sandwiched between the chassis standoff 16 and the heat sink standoff 38. The standoffs 16, 38 with the boss 62 sandwiched therebetween form a rigid support interface for the heat sink 36 relative to the chassis pan 14.

In the event of a dynamic load applied to the heat sink 36 during transportation of the assembled system, a major part of the dynamic loading may be transferred via the standoffs to the chassis pan, thereby reducing the risk of damage to the circuit board 26, the socket 30 or the IC package 28 due to the dynamic loading.

The circuit board 26 in a sense "floats" at the locus of the IC package 28 so as to have reduced stiffness and thus reduced resistance to the load applied to the underside 50 of the circuit board by the spring fingers 22, 24. The effective stiffness of the spring 18 is enhanced by the rigid trapping of the spring bosses between chassis standoffs and heat sink standoffs. This promotes efficient spring loading to the underside of the circuit board, which helps to hold the IC package 28 in thermal transfer engagement via the TIM 34 with the heat sink 36. Thus efficient operation of the heat sink 36 to dissipate heat from the IC package 28 may be promoted.

With the heat sink retention arrangement disclosed herein, including favorable handling of dynamic loads, the size of the heat sink may be increased to a mass of 1 kg, for example, without undue risk of damage during shipment to the circuit board, the IC package, the package socket or other components. Because the heat sink size may be increased, greater heat dissipation capability may be provided, thereby accommodating more advanced and heat intensive ICs.

Although the heat sink retention arrangement disclosed herein is suitable for relatively large heat sinks, it may also be used for smaller heat sinks, including heat sinks sized to accommodate a half-height form factor.

Furthermore, the spring 18 can be readily assembled with the circuit board 26 at or prior to system assembly. Moreover, there is generally a low part count for the heat sink retention arrangement disclosed herein, which fosters ease and speed of assembly and cost savings.

Another advantage of the heat sink retention arrangement disclosed herein is that it may be provided in a manner that is compliant with System Server Infrastructure (SSI) specifications that have been promoted by the assignee hereof (Intel Corporation) in cooperation with other companies to provide for increased standardization of design of some aspects of server computers.

In the embodiments illustrated herein, a single spring having a perimeter section and two inwardly extending spring fingers is shown. However, in other embodiments, two separate springs may be provided, each having a single spring finger that is mounted on a linear support mounted between two of the circuit board holes. Further, instead of providing the spring fingers on the sides 56, the spring fingers may alternatively be provided on the long sides 52.

The screw tension springs 48 may be omitted in some embodiments. However, the springs 48 may be helpful during assembly by keeping the lower portions of the retention screws out of the way during the operation of aligning the heat sink standoffs to the chassis standoffs. The springs 48 may also be helpful in the event of disassembly by causing the retention screws to pop up to indicate when the screws have been released from the chassis standoff.

Although only one IC (e.g., only one microprocessor) and only one circuit board have been shown in the above illustrations of the system 10, in alternative embodiments the system may include two or more circuit boards and/or two or more processors mounted within the chassis.

Although embodiments described above have been illustrated in the context of a workstation or server computer, the heat sink retention arrangements described above may be incorporated in any computer or other electronic device that requires dissipation of heat from an IC.

Thus, in some embodiments, a method includes providing a circuit board having a plurality of holes formed therethrough, and mounting a spring to an underside of the circuit board such that the mounted spring has a plurality of holes each of which is aligned with a respective one of the holes in the circuit board.

In other embodiments, a spring includes a perimeter section including a plurality of sides around an open space, a first spring finger that extends inwardly and upwardly in an inclined fashion from a first one of the sides, and a second spring finger that extends inwardly and upwardly in an inclined fashion from a second one of the sides that is opposite to the first one of the sides.

In still other embodiments, an assembly includes a circuit board and a spring mounted to an underside of the circuit board and having at least one spring finger to apply a load to the underside of the circuit board.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
   providing a circuit board having a plurality of holes formed therethrough; and
   mounting a spring to apply a load to an underside of the circuit board, the mounted spring having a plurality of holes each aligned with a respective one of the holes in the circuit board;
   wherein the spring includes a plurality of bosses, each having one of the holes of the spring formed therethrough, and the method further comprising:
   sandwiching each of the bosses of the spring between a respective chassis standoff and a respective heat sink standoff;
   wherein said circuit board holes are wide enough in diameter to accommodate the respective chassis standoff and a respective one of the bosses without touching or binding.

2. The method of claim 1, wherein the spring includes at least one spring finger to apply a load to the underside of the circuit board.

3. The method of claim 2, wherein the plurality of holes of the spring includes four holes.

4. The method of claim 3, wherein the plurality of holes of the circuit board includes four holes located to define a rectangle.

5. The method of claim 1, further comprising simultaneously inserting a fastener through one of the holes of the circuit board and through a corresponding hole of the spring.

6. The method of claim 1, wherein the mounting of the spring to the underside of the circuit board includes inserting each of a plurality of board attach fingers of the spring through a respective one of the holes of the circuit board.

7. A system comprising:
   a chassis;
   a plurality of chassis standoffs mounted on the chassis;
   a heat sink having a plurality of heat sink standoffs mounted on a lower side thereof;
   a spring including a plurality of bosses each sandwiched between a respective one of the chassis standoffs and a respective one of the heat sink standoffs; and
   a circuit board mounted in the chassis with the spring below the circuit board and the heat sink above the circuit board, the heat sink positioned to conduct heat from an integrated circuit (IC) package mounted on an upper side of the circuit board, the circuit board having a respective hole formed therein at a respective location of each of the heat sink standoffs;
   the spring including at least one spring finger to apply a load to an underside of the circuit board at a locus of the IC package;
   wherein said circuit board holes are wide enough in diameter to accommodate the respective chassis standoff and a respective one of the bosses without touching or binding.

8. The system of claim 7, wherein the spring includes two spring fingers in contact with the underside of the circuit board.

9. The system of claim 8, further comprising four fasteners each extending downwardly through a respective one of the heat sink standoffs, through a respective hole in the circuit board, through a respective hole in the spring, and into a respective one of the chassis standoffs.

* * * * *